United States Patent
Park

(10) Patent No.: US 8,437,199 B2
(45) Date of Patent: May 7, 2013

(54) SEMICONDUCTOR MEMORY DEVICE AND METHOD OF ERASING THE SAME

(75) Inventor: Jin Su Park, Daegu (KR)

(73) Assignee: SK Hynix Inc., Gyeonggi-do (KR)

( * ) Notice: Subject to any disclaimer, the term of this patent is extended or adjusted under 35 U.S.C. 154(b) by 125 days.

(21) Appl. No.: 13/176,859

(22) Filed: Jul. 6, 2011

(65) Prior Publication Data

US 2012/0008415 A1    Jan. 12, 2012

(30) Foreign Application Priority Data

Jul. 9, 2010   (KR) .......................... 10-2010-0066521

(51) Int. Cl.
*G11C 16/04*    (2006.01)
(52) U.S. Cl.
USPC .............. 365/185.29; 365/185.25; 365/185.17
(58) Field of Classification Search ............. 365/185.29, 365/185.25, 185.17
See application file for complete search history.

(56) References Cited

U.S. PATENT DOCUMENTS

| | | | |
|---|---|---|---|
| 5,589,699 A * | 12/1996 | Araki | 257/316 |
| 7,577,059 B2 | 8/2009 | Pyeon | |
| 7,916,547 B2 * | 3/2011 | Hosono | 365/185.21 |
| 8,023,327 B2 * | 9/2011 | Futatsuyama | 365/185.17 |
| 8,102,708 B2 * | 1/2012 | Kim | 365/185.03 |
| 2012/0170366 A1 * | 7/2012 | Kim et al. | 365/185.03 |

* cited by examiner

*Primary Examiner* — Tuan T. Nguyen
(74) *Attorney, Agent, or Firm* — William Park & Associates Patent Ltd.

(57) ABSTRACT

A method of erasing a semiconductor memory device includes precharging a channel of a selected memory cell of a selected string including memory cells; boosting a channel of the selected string by supplying a positive voltage to word lines of the respective memory cells of the selected string; and erasing the selected memory cell by supplying an erase voltage lower than the positive voltage to a selected word line associated with the selected memory cell.

18 Claims, 4 Drawing Sheets

SEMICONDUCTOR MEMORY DEVICE AND METHOD OF ERASING THE SAME

CROSS-REFERENCE TO RELATED APPLICATION

Priority to Korean patent application number 10-2010-0066521 filed on Jul. 9, 2010, the entire disclosure of which is incorporated by reference herein, is claimed.

BACKGROUND

Exemplary embodiments relate generally to an integrated circuit and, more particularly, to a semiconductor memory device and a method of erasing the same.

The memory array of a memory device, e.g., a flash memory device such as a NAND flash memory device includes a plurality of memory blocks. Each of the memory blocks includes a plurality of strings. Each of the strings includes a source select transistor coupled to a common source line, a plurality of memory cells, and a drain select transistor coupled to a bit line.

Prior to a program operation for storing data in specific memory cells of the flash memory device, an erase operation for erasing data stored in the specific memory cells must be performed. In the case of the NAND flash memory, the erase operation is performed on a memory-block basis. Therefore, each memory-block is a unit of erase operation, and even if only a portion of the memory-block is updated, all the cells included in a corresponding memory-block is erased and then programmed, and thus this increases the time taken to update data in the specific memory cells.

BRIEF SUMMARY

Exemplary embodiments relate to a nonvolatile memory device and a method of erasing the same, which are capable of improving the operating speed of the nonvolatile memory device by selectively erasing data stored in specific memory cells.

A method of erasing a semiconductor memory device, according to an aspect of the present disclosure includes, precharging a channel of a selected memory cell of a selected string including memory cells; boosting a channel of the selected string by supplying a positive voltage to word lines of the respective memory cells of the selected string; and erasing the selected memory cell by supplying an erase voltage lower than the positive voltage to a selected word line associated with the selected memory cell.

The channel of the selected memory cell is precharged by supplying an erase permission voltage to a selected bit line coupled to the selected string.

An erase inhibition voltage is supplies to an unselected bit line, which is coupled to an unselected string including a plurality of memory cells, during supplying the erase permission voltage to the selected bit line.

A semiconductor memory device according to another aspect of the present disclosure includes strings, each including memory cells coupled in series; bit lines coupled to the respective strings; a page buffer group coupled to the bit lines; a voltage supply circuit coupled to word lines of the memory cells; and a control circuit configured to enable the page buffer group to be provided an erase permission voltage to a selected bit line coupled to a selected string for precharging a channel of a selected memory cell of the selected string, and enable the voltage supply circuit to be provided a positive voltage to the word lines for boosting a channel of the selected string and to be provided an erase voltage lower than the positive voltage to a selected word line associated with the selected memory cell for erasing the selected memory cell.

The erase permission voltage is a positive voltage.

The page buffer group supplies an erase inhibition voltage to an unselected bit line, which is coupled to an unselected string, during supplying the erase permission voltage to the selected bit line.

The erase permission voltage is higher than the erase inhibition voltage.

The erase inhibition voltage comprises a zero voltage.

The positive voltage is supplied to an unselected word line during supplying the erase voltage to the selected word line.

The erase voltage comprises a negative voltage.

The voltage supply circuit comprises pass transistors configured to transmit the positive voltage and the erase voltage to the word lines.

The pass transistors are formed on a p-well formed in an n-well.

The pass transistor transmits the erase voltage to the selected word lines, a negative voltage is supplied to the p-well and the n-well of the pass transistor.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
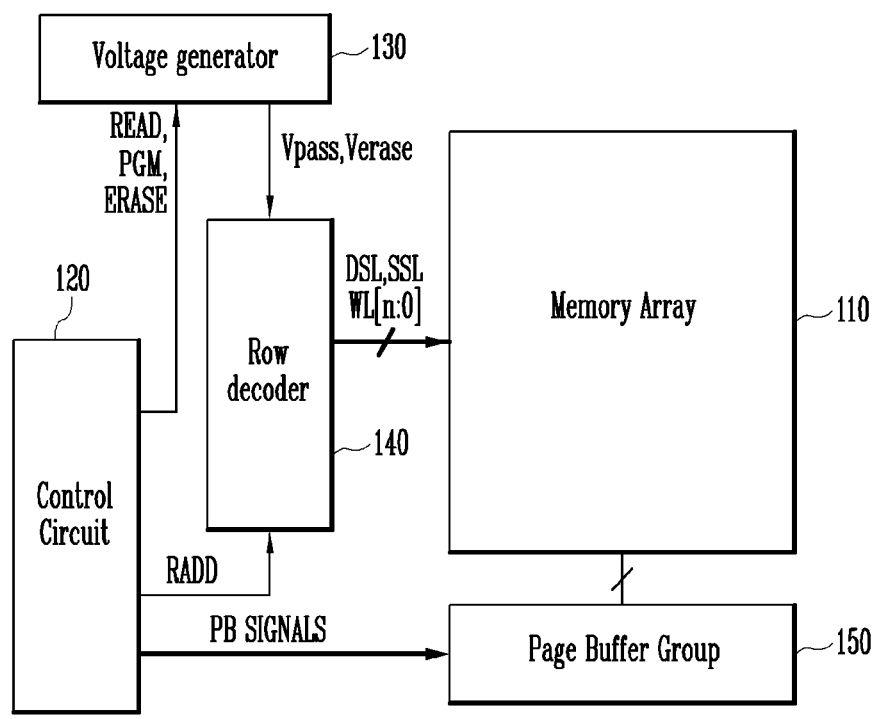
FIG. 1 is a block diagram of a semiconductor memory device according to an exemplary embodiment of this disclosure.

FIG. 1 is a block diagram of a semiconductor memory device according to an exemplary embodiment of this disclosure.

Referring to FIG. 1, the semiconductor memory device according to the exemplary embodiment of this disclosure includes a memory array 110, an operation circuit group (130, 140, and 150) for performing an erase operation, a program operation, or a read operation of memory cells included in the memory array 110, and a control circuit 120 for controlling the operation circuit group (130, 140, and 150) in order to set the threshold voltage levels of specific memory cells to any one of an erase level and program levels based on received data.

In the case of a NAND flash memory device, the operation circuit group includes a voltage supply circuit (130 and 140) and a page buffer group 150.

The memory array 110 includes a plurality of memory blocks. Each of the memory blocks includes a plurality of memory cells, coupled to local word lines and bit lines and configured to store data.

The control circuit 120 internally generates a program operation signal PGM, a read operation signal READ, or an erase operation signal ERASE in response to a command signal and also generates control signals PB SIGNALS for controlling the page buffers (not shown) of the page buffer group 150 according to a type of the operation. Furthermore, the control circuit 120 generates a row address signal RADD in response to an address signal.

A voltage supply circuit supplies operating voltages for the program operation, the erase operation, or the read operation of memory cells to a relevant memory block in response to the signals READ, PGM, ERASE, and RADD of the control circuit 120. The voltage supply circuit may include a voltage generator 130 and a row decoder 140.

The voltage generator 130 outputs the operating voltages, for programming, reading, or erasing memory cells, to global lines in response to the operating signals PGM, READ, and ERASE (that is, the internal command signals of the control circuit 120). The voltage generator 130 outputs erase operating voltages (for example, Verase and Vpass) for an erase operation to the global lines when memory cells are erased.

The row decoder 140 transfers the operating voltages of the voltage generator 130 to a specific memory block of the memory array 110 in response to the row address signals RADD.

The page buffer group 150 includes the page buffers (not shown) coupled to respective bit lines BL1 to BLk. The page buffer group 150 supplies voltages used to store data in memory cells to the respective bit lines BL1 to BLk in response to the control signals PB SIGNALS. More particularly, the page buffer group 150 precharges the bit lines BL1 to BLk in the erase operation of memory cells. That is, the page buffer group 150 controls voltages of the bit lines BL1 to BLk according to an operation mode of a memory cell. For example, the page buffer group 150 configured to supply an erase permission voltage or an erase inhibition voltage to the bit lines BL1 to BLk controlled by the control circuit 120 during the erase operation.

In the erase operation, the voltage generator 130 outputs the erase operating voltages Verase and Vpass for the erase operation of memory cells to global word lines in response to the erase signal ERASE. The row decoder 140 supplies the erase operating voltages Verase and Vpass to local word lines of a specific memory block of the memory array 110 in response to the row address signals RADD.

The row decoder 140 includes a block switch coupled to each of the memory blocks. The block switch transmits the erase operating voltages Verase and Vpass to a memory block selected in response to the row address signals RADD of the control circuit 120.

It is hereinafter assumed that one of the block switches of the row decoder 140 is coupled to one of the memory blocks of the memory array 110.

Figure 2:
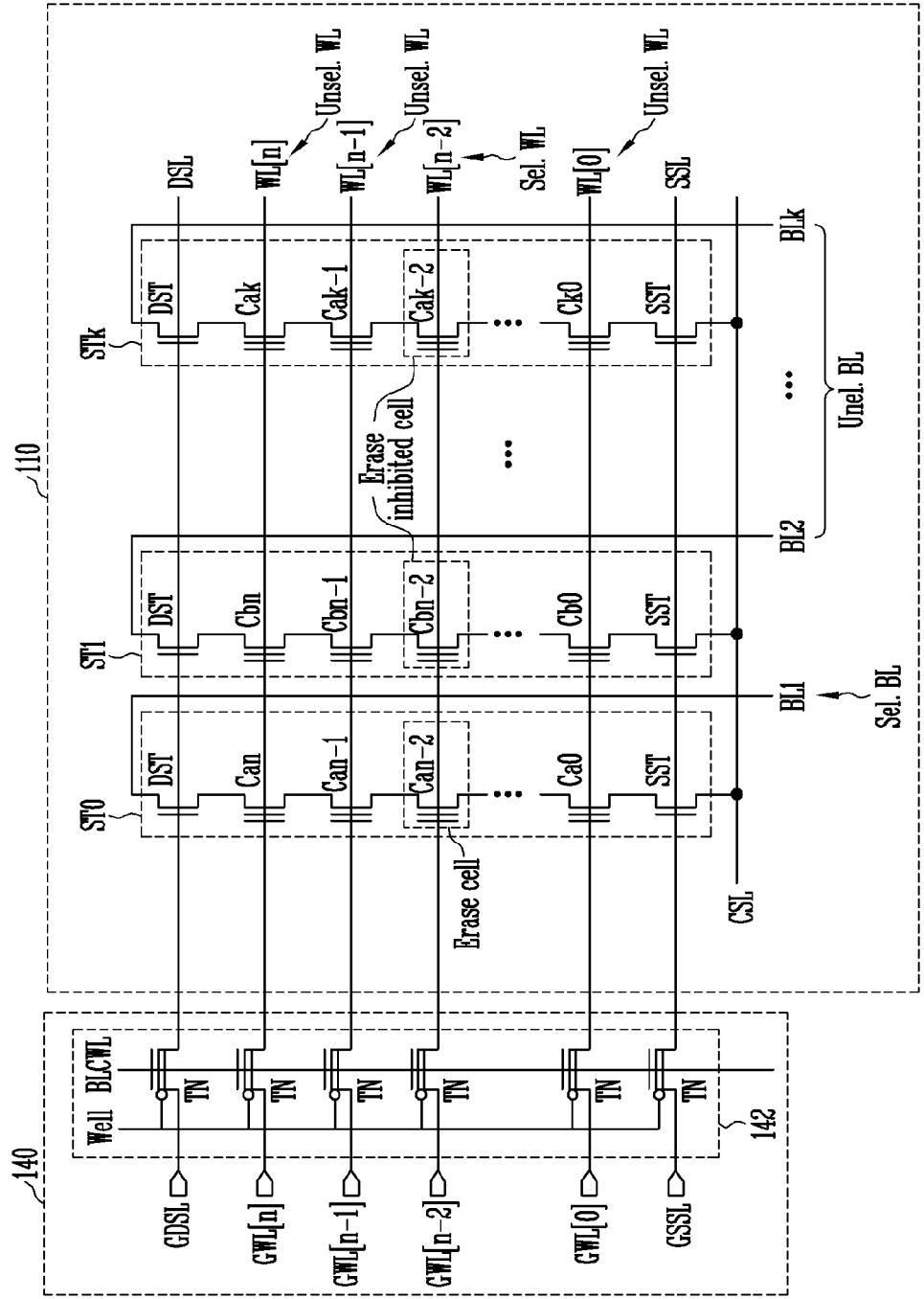
FIG. 2 is a circuit diagram of the memory block and the block switch of the semiconductor memory device according to an exemplary embodiment of this disclosure.

FIG. 2 is a circuit diagram of the memory block and the block switch of the semiconductor memory device according to an exemplary embodiment of this disclosure.

Referring to FIG. 2, each of the memory blocks of the memory array 110 includes a plurality of strings ST0 to STk. Each (for example, ST0) of the strings includes a source select transistor SST coupled to a common source line CSL, a plurality of memory cells Ca0 to Can, and a drain select transistor DST coupled to a bit line BL1. The gate of the source select transistor SST is coupled to a source select line SSL. The gates of the memory cells Ca0 to Can coupled in series are coupled to respective word lines WL0 to WLn. The gate of the drain select transistor DST is coupled to a drain select line DSL. The strings ST0 to STk are coupled to the respective bit lines BL1 to BLk through the drain select transistors DST. The strings are in common coupled to the common source line CSL through the respective source select transistors SST. The source select line SSL, the drain select line DSL, and the word lines WL0 to WLn coupled to the memory array 110 are defined as local lines. Although not shown, the memory array 110 is formed on a bulk, including a P-well and an N-well formed by implanting impurities into a semiconductor substrate.

In the exemplary embodiment of the present disclosure, in order to erase a specific memory cell, a selected bit line Sel.BL coupled to the selected string ST0 including an erase cell Erase Cell (that is a selected memory cell) is precharged to the erase permission voltage level. The erase permission voltage is a positive voltage. Next, the selected bit line Sel.BL is electrically separated from a selected string ST0 coupled to the selected bit line Sel.BL, and the channel voltage of the selected string ST0 is then boosted. Next, the threshold voltage of the erase cell Erase Cell drops to the erase level by supplying an erase voltage Verase lower than a positive voltage to a selected word line Sel.WL, coupled to the erase cell Erase Cell, so that holes are injected into the floating gate of the erase cell Erase Cell. A more detailed erase operation of the erase cell Erase Cell is described later with reference to FIGS. 4 and 5A.

Meanwhile, the holes should not be injected into the floating gates of erase-inhibited cells Erase Inhibited Cell whose threshold voltages should not shift to the erase level, although the erase-inhibited cells, together with the erase cell Erase Cell, are coupled to the selected word line Sel.WL. To this end, an erase inhibition voltage is supplied to unselected bit lines Unsel.BL coupled to unselected strings ST1 to STk including the erase-inhibited cells. The erase inhibition voltage is a zero voltage. A more detailed operation of the erase-inhibited cells is described later with reference to FIGS. 4 and 5B.

The block switch 142 of the row decoder 140 transmits the erase operating voltages Verase and Vpass, received through the global word lines GWL[n:0], to the local word lines WL[n:0] of the memory block in response to a block select signal BCLWL enabled in response to the row address signals RADD. To this end, the block switch 142 includes pass transistors TN, coupled between the global lines GDSL, GWL[n:0], and GSSL and the local lines DSL, WL[n:0], and SSL and driven in response to the block select signal BCLWL. The pass transistors TN, for example, include triple-well transistors for transmitting voltages such as a program voltage, a pass voltage Vpass of a positive voltage level, or a power supply voltage of a positive level or the erase voltage Verase lower than the pass voltage Vpass, received through the global lines GDSL, GWL[n:0], and GSSL, to the local lines DSL, WL[n:0], and SSL. Here, according to an example, the triple-well transistors are a triple-well high voltage NMOS transistors.

The triple-well high voltage NMOS transistors are described below.

Figure 3:
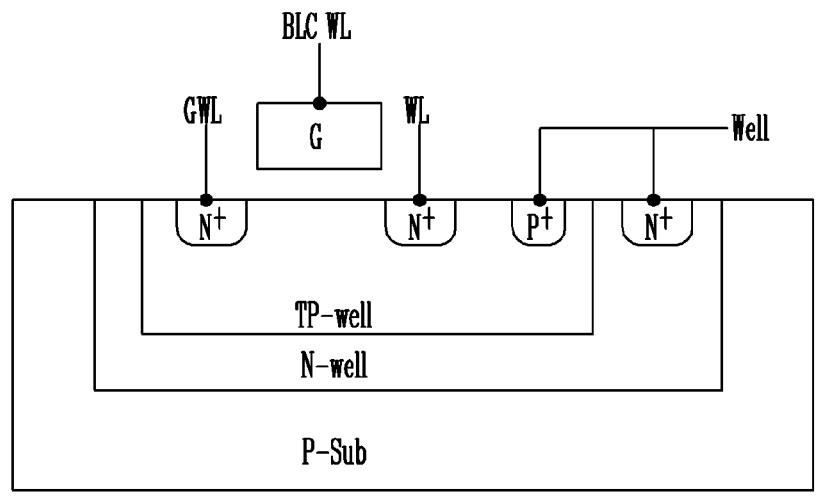
FIG. 3 is a diagram illustrating transistors constituting the block switch of FIG. 2.

FIG. 3 is a diagram illustrating the transistors constituting the block switch 142 of FIG. 2.

Referring to FIG. 3, each of the triple-well high voltage NMOS transistors includes an N-well formed within a P-type substrate P-Sub, a TP-well (that is p-well) formed on the N-well, a gate G formed over the TP-well, and source and drain junctions N+ formed in the P-type substrate P-Sub on both sides of the gate G.

The source and drain junctions N+ are coupled to a global line (for example, GWL) and a local line (for example, WL). The gate G is coupled to an input terminal for the block select signal BCLWL. A contact area P+ formed in the TP-well and a contact area N+ formed in the N-well are coupled to an input terminal for a well bias Well.

Although a negative voltage is supplied to the source and the drain junctions N+ of the triple-well high voltage NMOS transistor, the leakage of current to the triple well may decrease by supplying the negative well bias Well.

Figure 4:
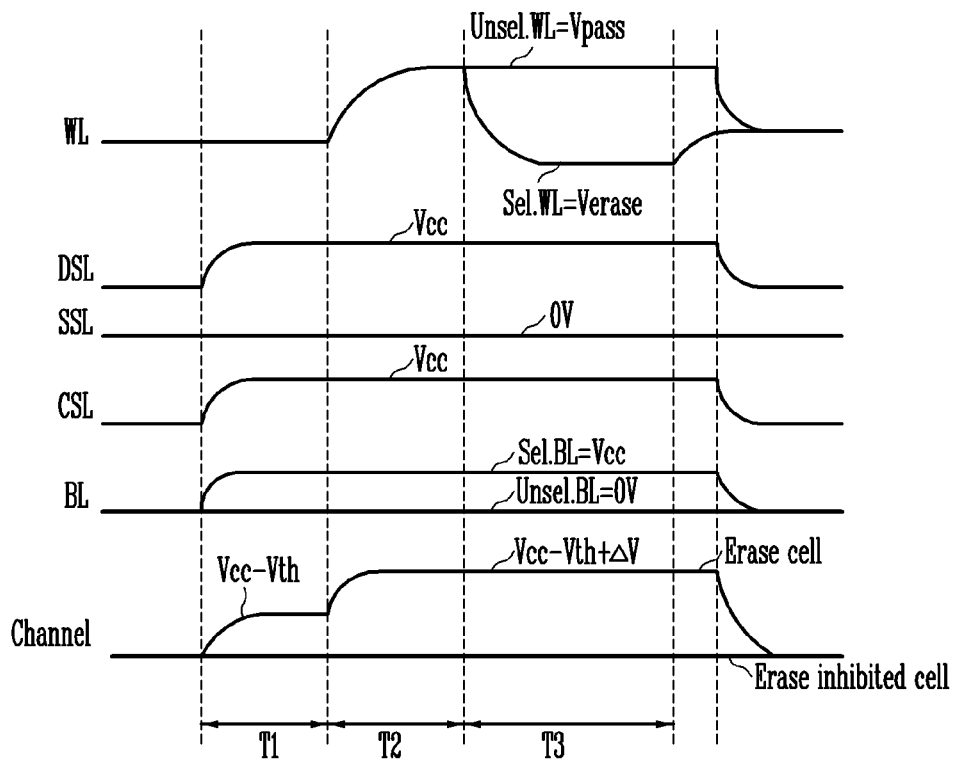
FIG. 4 shows waveforms illustrating a method of erasing the semiconductor memory device according to an exemplary embodiment of this disclosure.

FIG. 4 shows waveforms illustrating a method of erasing the semiconductor memory device according to an exemplary embodiment of this disclosure.

Referring to FIG. 4, the erase method according to the exemplary embodiment of this disclosure is performed during the first to third periods T1 to T3.

During the first period T1, the drain select transistor DST coupled to the selected bit line Sel.BL is turned on by supplying the power supply voltage Vcc to the drain select line DSL. The source of a memory cell coupled to the selected bit line Sel.BL is floated by supplying voltage of 0 V to the source select line SSL. Furthermore, the power supply voltage Vcc is supplied to the common source line CSL and the erase permission voltage of a positive voltage level (for example, the power supply voltage Vcc) is supplied to the selected bit line Sel.BL.

If memory cells Can-1 and Can between the drain select transistor DST and the erase cell Erase Cell are an erase state, the channel of the selected string ST0 including the erase cell Erase Cell is precharged with a level (Vcc-Vth) in which the threshold voltage Vth of the drain select transistor DST is subtracted from the power supply voltage Vcc supplied to the selected bit line Sel.BL. Accordingly, the drain select transistor DST coupled to the selected string ST0 is turned off, so that the selected string ST0 including the erase cell Erase Cell is electrically separated from the selected bit line Sel.BL and the channel of the selected string ST0 including the erase cell Erase Cell becomes a floating state.

During the first period T1, the unselected strings ST1 to STk including the erase-inhibited cells Erase Inhibited Cell remain coupled to the unselected bit lines Unsel.BL because the erase inhibition voltage of 0 V lower than the erase permission voltage is supplied to the unselected bit lines Unsel.BL.

During the second period T2, the channel voltage of the selected string ST0 including the erase cell Erase Cell is boosted. To this end, the channel voltage of the selected string ST0 electrically separated from the selected bit line Sel.BL and the common source line CSL is boosted by supplying the pass voltage Vpass of a positive voltage level to the word lines Unsel.WL and Sel.WL. Consequently, the channel voltage of the floated selected string ST0 including the erase cell Erase Cell is boosted by the pass voltage Vpass, thus rising by ΔV. However, the channel voltages of the unselected strings ST1 to STk including the erase-inhibited cells Erase Inhibited Cell coupled to the unselected bit lines Unsel.BL are not boosted.

Meanwhile, if the memory cells Can-1 and Can between the drain select transistor DST and the erase cell Erase Cell are a program state, the channel voltage of the selected string ST0 does not become the level (Vcc-Vth) during the first period T1. However, during the second period T2, it is possible to boost the channel voltage of the selected string ST0 by supplying the pass voltage Vpass to the word lines Unsel.WL, and Sel.WL.

During the third period T3, the threshold voltage of the erase cell Erase Cell is lowered. To this end, an erase voltage lower than the positive level, e.g., a negative erase voltage Verase (for example, −5 V) is supplied to the selected word line Sel.WL. A high voltage difference is generated between the erase cell Erase Cell and the channel of the erase cell Erase Cell by means of the erase voltage Verase lower than the positive voltage level, so that holes are injected into the erase cell Erase Cell. Consequently, the threshold voltage of the erase cell Erase Cell drops to the erase level.

Meanwhile, during the third period T3, the pass voltage Vpass of the positive voltage level for forming a channel continues to be supplied to the unselected word lines Unsel.WL, and the erase inhibition voltage of 0 V continues to be supplied to the unselected bit lines Unsel.BL. Accordingly, a high voltage difference of the degree that a tunneling phenomenon occurs is not generated between the memory cells coupled to the unselected word lines Unsel. WL and channels thereof and between the erase-inhibited cells Erase Inhibited Cell coupled to the selected word line Sel.WL and channels thereof. Consequently, the threshold voltages of the memory cells do not drop to the erase level.

Figure 5A:
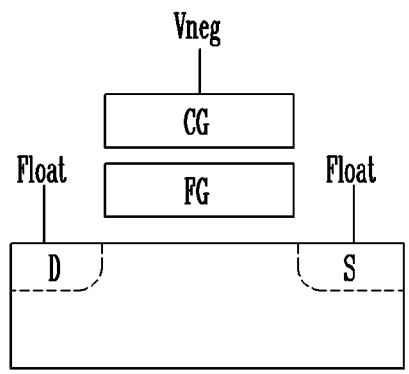
FIGS. 5A and 5B are diagrams illustrating an erase cell and erase-inhibited cells coupled to a selected word line in the erase operation of the semiconductor memory device according to an exemplary embodiment of this disclosure.
Figure 5B:
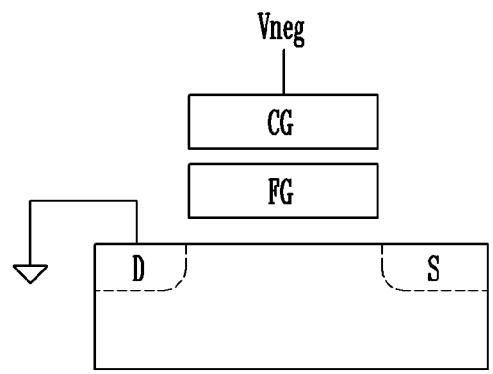
Figure 6:
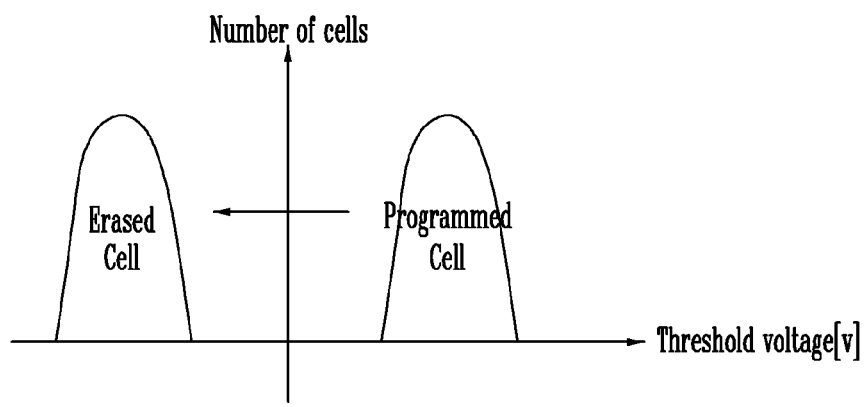
FIG. 6 is a diagram illustrating a shift of threshold voltages in the method of erasing the semiconductor memory device according to the exemplary embodiment of this disclosure.

FIGS. 5A and 5B are diagrams illustrating an erase cell and erase-inhibited cells coupled to a selected word line in the erase operation of the semiconductor memory device according to an exemplary embodiment of this disclosure. FIG. 6 is a diagram illustrating a shift of threshold voltages in the method of erasing the semiconductor memory device according to the exemplary embodiment of this disclosure.

Referring to FIG. 5A, in the third period shown in FIG. 4, the channel voltage of the selected string ST0 including the erase cell Erase Cell is boosted from the floating state, thus having a level (Vcc−Vth+ΔV) (for example, 8V). In this state, when the erase voltage lower than the positive voltage level (for example, −5 V) is supplied to the control gate CG of the erase cell through the selected word line, a high voltage difference is generated between the control gate CG of the erase cell and the channel thereof. Accordingly, holes are injected into the floating gate FG of the erase cell, so that a threshold voltage of the erase cell, having a program state, shifts to a threshold voltage of the erase level as shown in FIG. 6.

Referring to FIG. 5B, in the third period shown in FIG. 4, the channels of the unselected strings ST1 to STk including the erase-inhibited cells Erase Inhibited Cell are coupled to the unselected bit lines Unsel.BL. Although the erase voltage lower than the positive voltage level (for example, −5 V) is supplied to the control gates CG of the erase-inhibited cells Erase Inhibited Cell through the selected word line Sel.WL, a high voltage difference of the degree that a tunneling phenomenon will be generated is not generated between the control gate CG of the erase-inhibited cells Erase Inhibited Cell and the channel thereof. Accordingly, since holes are not injected into the floating gates FG of the erase-inhibited cells Erase Inhibited Cell, the threshold voltages of the erase-inhibited cells Erase Inhibited Cell remain in a program level as shown in FIG. 6.

In accordance with the present disclosure, the channel voltage of a selected string including an erase cell is boosted, and a high voltage difference is generated between the channel of the erase cell and a word line coupled to the erase cell by supplying an erase voltage having a low voltage value, e.g., a negative voltage to the word line so that holes are injected into the erase cell. Accordingly, the threshold voltage of the erase cell can be lowered, i.e., the erase cell is erased. Furthermore, erase-inhibited cells coupled to the same word line as the erase cell are coupled to unselected bit lines to which the erase inhibition voltage of 0 V is supplied in order to prevent a high voltage difference from occurring to the extent that a tunneling phenomenon is generated between the channels of the erase-inhibited cells and the word line. Accordingly, the erase-inhibited cells are not erased. As described above, a specific memory cell can be selectively erased, and thus the data update speed of a semiconductor memory device may increase.

What is claimed is:

1. A method of erasing a semiconductor memory device, comprising:
   precharging a channel of a selected memory cell of a selected string including memory cells;
   boosting a channel of the selected string by supplying a positive voltage to word lines of the respective memory cells of the selected string; and
   erasing the selected memory cell by supplying an erase voltage lower than the positive voltage to a selected word line associated with the selected memory cell.

2. The method of claim 1, wherein the channel of the selected memory cell is precharged by supplying an erase permission voltage to a selected bit line coupled to the selected string.

3. The method of claim 2, wherein the erase permission voltage is a positive voltage.

4. The method of claim 2 further comprising, supplying an erase inhibition voltage to an unselected bit line, which is coupled to an unselected string including a plurality of memory cells, during supplying the erase permission voltage to the selected bit line.

5. The method of claim 4, wherein the erase permission voltage is higher than the erase inhibition voltage.

6. The method of claim 4, wherein the erase inhibition voltage is a zero voltage.

7. The method of claim 1, wherein the positive voltage is supplied to an unselected word line during supplying the erase voltage to the selected word line.

8. The method of claim 1, wherein the erase voltage comprises a negative voltage.

9. A semiconductor memory device, comprising:
   strings, each including memory cells coupled in series;
   bit lines coupled to the respective strings;
   a page buffer group coupled to the bit lines;
   a voltage supply circuit coupled to word lines of the memory cells; and
   a control circuit configured to enable the page buffer group to be provided an erase permission voltage to a selected bit line coupled to a selected string for precharging a channel of a selected memory cell of the selected string, and enable the voltage supply circuit to be provided a positive voltage to the word lines for boosting a channel of the selected string and to be provided an erase voltage lower than the positive voltage to a selected word line associated with the selected memory cell for erasing the selected memory cell.

10. The semiconductor memory device of claim 9, wherein the erase permission voltage is a positive voltage.

11. The semiconductor memory device of claim 9, the page buffer group supplies an erase inhibition voltage to an unselected bit line, which is coupled to an unselected string, during supplying the erase permission voltage to the selected bit line.

12. The semiconductor memory device of claim 11, wherein the erase permission voltage is higher than the erase inhibition voltage.

13. The semiconductor memory device of claim 12, wherein the erase inhibition voltage comprises a zero voltage.

14. The semiconductor memory device of claim 9, wherein the positive voltage is supplied to an unselected word line during supplying the erase voltage to the selected word line.

15. The semiconductor memory device of claim 9, wherein the erase voltage comprises a negative voltage.

16. The semiconductor memory device of claim 9, wherein the voltage supply circuit comprises pass transistors configured to transmit the positive voltage and the erase voltage to the word lines.

17. The semiconductor memory device of claim 16, wherein the pass transistors are formed on a p-well formed in a n-well.

18. The semiconductor memory device of claim 16, wherein the pass transistor transmits the erase voltage to the selected word lines, a negative voltage is supplied to the p-well and the n-well of the pass transistor.

* * * * *